(12) United States Patent
Park

(10) Patent No.: US 10,863,616 B1
(45) Date of Patent: Dec. 8, 2020

(54) CIRCUIT BOARD INCLUDING NOISE REMOVING UNIT

(71) Applicant: Samsung Electro-Mechanics Co., Ltd., Suwon-si (KR)

(72) Inventor: Jeong Hyun Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/919,407

(22) Filed: Jul. 2, 2020

(30) Foreign Application Priority Data

Dec. 13, 2019 (KR) .......................... 10-2019-0167021

(51) Int. Cl.
*H05K 1/02* (2006.01)
(52) U.S. Cl.
CPC ......... *H05K 1/0225* (2013.01); *H05K 1/0233* (2013.01); *H05K 2201/093* (2013.01); *H05K 2201/1003* (2013.01)
(58) Field of Classification Search
CPC .............. H05K 1/0225; H05K 1/0233; H05K 2201/1003; H05K 2201/093
USPC ........................................................ 174/260
See application file for complete search history.

(56) References Cited

U.S. PATENT DOCUMENTS

| 5,023,753 | A | | 6/1991 | Abe | |
|---|---|---|---|---|---|
| 5,357,051 | A | * | 10/1994 | Hwang | ................ H05K 1/0228 174/250 |
| 5,871,655 | A | * | 2/1999 | Lee | ...................... G11B 5/4853 216/22 |
| 6,861,899 | B2 | * | 3/2005 | Konishi | ............... H05K 1/0231 327/565 |
| 7,167,378 | B2 | * | 1/2007 | Yamada | ............... H05K 1/0228 333/100 |
| 7,426,118 | B2 | * | 9/2008 | Tan | ...................... H05K 1/0228 174/250 |
| 10,491,184 | B1 | * | 11/2019 | Yan | ...................... H03H 7/1716 |
| 2007/0075432 | A1 | * | 4/2007 | Shu | .......................... H01L 23/50 257/774 |
| 2008/0149366 | A1 | * | 6/2008 | Suzuki | ................ G11B 7/0935 174/250 |

FOREIGN PATENT DOCUMENTS

| JP | 6373912 B2 | 8/2018 |
|---|---|---|
| KR | 1990-0012516 A | 8/1990 |
| KR | 2003-0049920 A | 6/2003 |

* cited by examiner

*Primary Examiner* — Sherman Ng
(74) *Attorney, Agent, or Firm* — NSIP Law

(57) ABSTRACT

A circuit board includes an insulating layer; and a wiring layer disposed on a surface of the insulating layer, wherein the wiring layer includes a noise canceling region including a first wiring having a linear shape; and a second wiring having a linear shape and disposed side by side with the first wiring, wherein the first wiring and the second wiring include a bent portion.

19 Claims, 4 Drawing Sheets

II-II'

CIRCUIT BOARD INCLUDING NOISE REMOVING UNIT

CROSS-REFERENCE TO RELATED APPLICATION(S)

This application claims the benefit under 35 USC 119(a) of Korean Patent Application No. 10-2019-0167021 filed on Dec. 13, 2019, in the Korean Intellectual Property Office, the entire disclosure of which is incorporated herein by reference for all purposes.

BACKGROUND

1. Field

This application relates to a circuit board including a noise removing unit.

2. Description of Related Art

Among electrical circuits constituting an electronic device, a digital processing circuit processing a digital signal includes a switching element that repeats ON/OFF switching at high speed, and noise including a high-frequency current is generated when the switching element is switched between ON and OFF states.

This high-frequency current may flow into another circuit sharing a ground with the switching element, causing surrounding circuits to malfunction.

Therefore, in a conventional case, the noise is removed or blocked by mounting chip-type passive devices on a circuit board. For example, noise generated in a circuit board is removed or blocked using π-type filter in which two chip capacitors and one chip inductor are connected in a π configuration.

In the conventional case, since a process of mounting a plurality of passive devices, such as chip capacitors and a chip inductor, on a circuit board is performed, there is a problem that a manufacturing cost and a manufacturing time of the circuit board increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a circuit board including an insulating layer; and a wiring layer disposed on a surface of the insulating layer, wherein the wiring layer includes a noise canceling region including a first wiring having a linear shape; and a second wiring having a linear shape and disposed side by side with the first wiring, wherein the first wiring and the second wiring include a bent portion.

The wiring layer may further include a ground region disposed outside of the noise canceling region, and a first end and a second end of the second wiring may be connected to the ground region.

In the bent portion, the first wiring may include a first straight portion; a second straight portion disposed side by side with the first straight portion; and a first connection portion connecting an end portion of the first straight portion to an end portion of the second straight portion.

The first wiring and the second wiring may be configured so that a current flowing in the first straight portion and a current flowing in the second straight portion flow in opposite directions relative to each other.

A separation distance between the first straight portion and the second straight portion may be 1 mm or less.

In the bent portion, the second wiring may include a third straight portion disposed side by side with the first straight portion; a fourth straight portion disposed side by side with the second straight portion; and a second connection portion disposed side by side with the first connection portion and connecting an end portion of the third straight portion to an end portion of the fourth straight portion.

The first wiring and the second wiring may be configured so that a current flowing in the first connection portion and a current flowing in the second connection portion flow in opposite directions relative to each other.

The first straight portion, the second straight portion, the third straight portion, and the fourth straight portion each may have a length of 3 mm or more.

A separation distance between the first wiring and the second wiring may be 1 mm or less.

The circuit board may further include an electronic device mounted on the circuit board and electrically connected to the first wiring and the second wiring.

The circuit board may further include a first electrode and a second electrode disposed in the mounting region, wherein the electronic device may be mounted on the first electrode and the second electrode, the first wiring may be connected to the first electrode and may serve as a power wiring that supplies power to the electronic device via the first electrode, and the second wiring may be connected to the second electrode and may serve as a ground wiring that supplies a ground to the electronic device via the second electrode.

In the noise canceling region, the first wiring and the second wiring may be configured so that a current flowing in the first wiring and a current flowing in the second wiring flow in opposite directions relative to each other.

The first wiring and the second wiring each may have a meander shape including the bent portion.

The circuit board may further include a passive device electrically connected to the first wiring and the second wiring.

In the bent portion, the first wiring may include a first straight portion; a second straight portion disposed side by side with the first straight portion; a first connection portion; a first transition portion connecting an end portion of the first straight portion to a first end portion of the first connection portion; and a second transition portion connecting an end portion of the second straight portion to a second end portion of the first connection portion.

The first transition portion and the second transition portion each may have a diagonal shape.

A first included angle between the first straight portion and the first transition portion may be 135°, a second included angle between the first transition portion and the first connection portion may be 135°, a third included angle between the second straight portion and the second transition portion may be 135°, and a fourth included angle between the second transition portion and the first connection portion may be 135°.

The first transition portion and the second transition portion each may have a curved shape.

In another general aspect, a circuit board includes an insulating layer; and a wiring layer disposed on a surface of the insulating layer, wherein the wiring layer includes a noise canceling region including a first wiring having a"

meander shape; and a second wiring having a meander shape following the meander shape of the first wiring and spaced apart from the first wiring.

The first wiring and the second wiring may be configured so that a magnetic field generated by a current flowing in the first wiring cancels a magnetic field generated by a current flowing in the second wiring.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
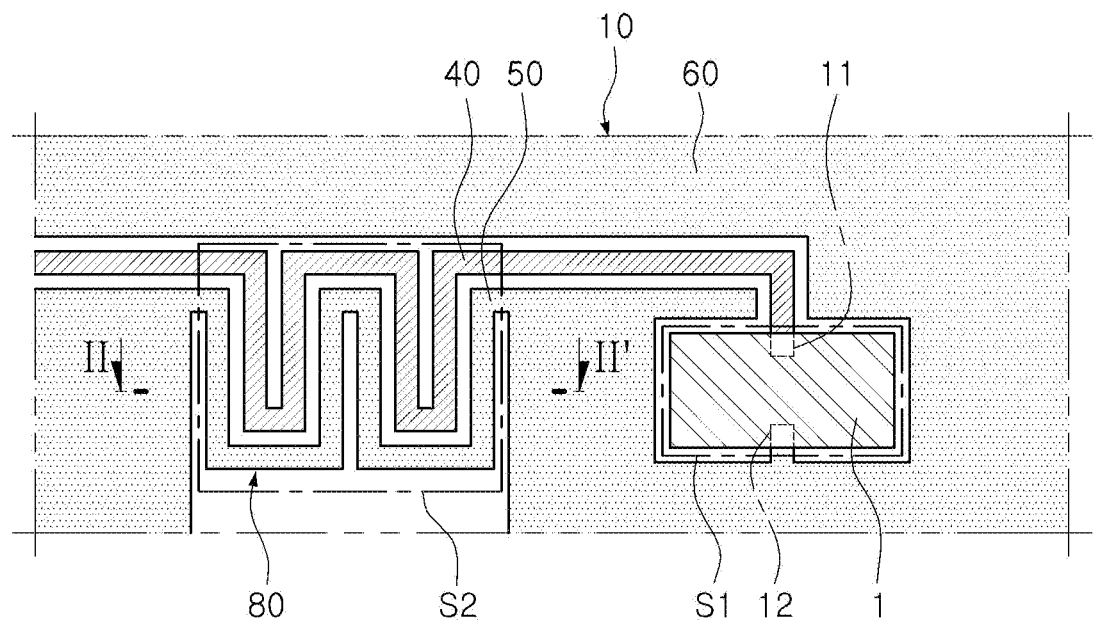
FIG. 1 is a plan view schematically showing an example of a circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when one element is described as being "connected to" or "coupled to" another element, the one element may be directly "connected to" or "coupled to" the other element, or there may be one or more other elements intervening therebetween. In contrast, when one element is described as being "directly connected to" or "directly coupled to" another element, there can be no other element intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
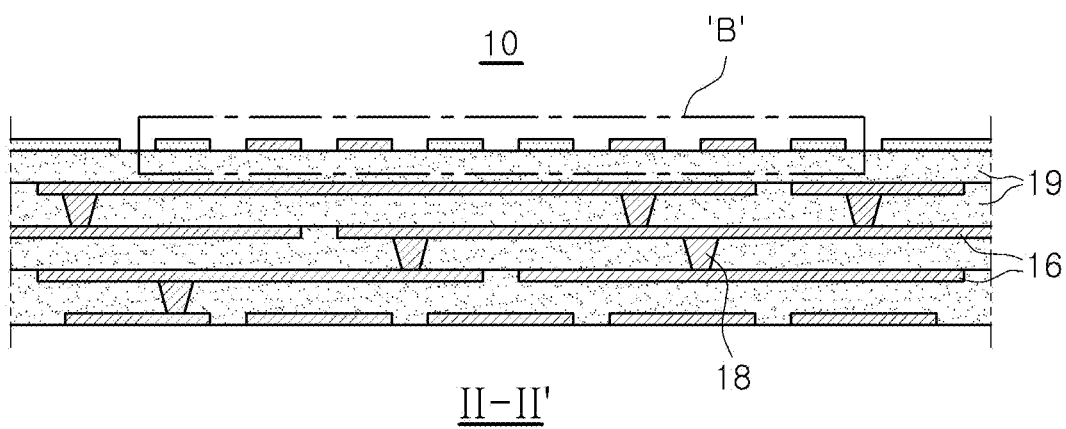
FIG. 2 is a cross-sectional view taken along the line Ill l' in FIG. 1.
Figure 3:
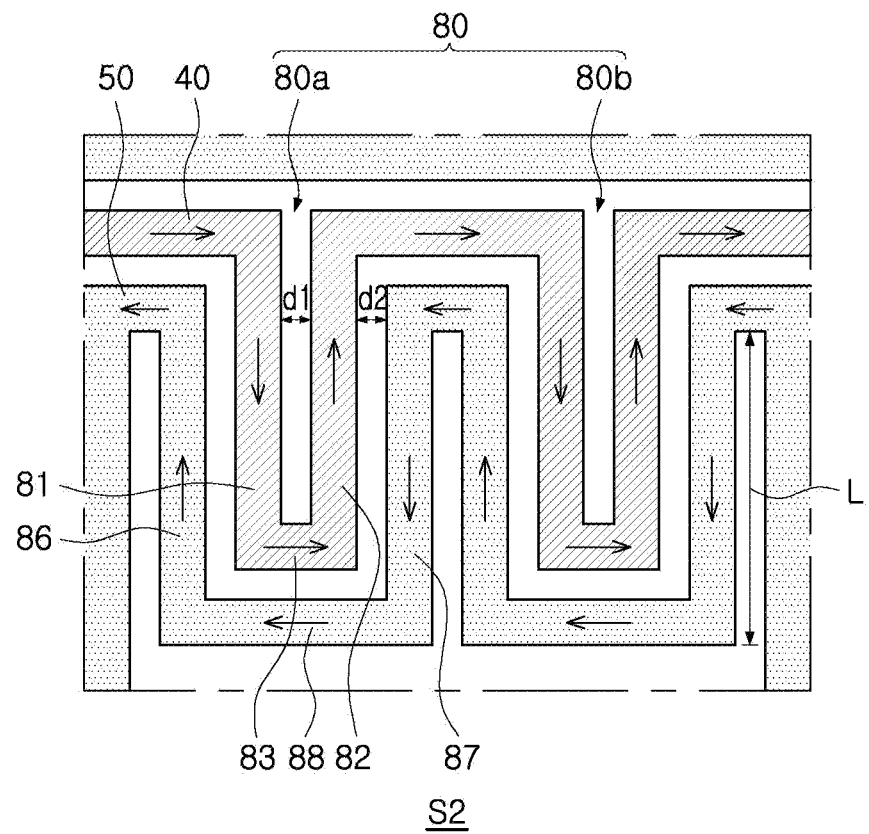
FIG. 3 is an enlarged view of a noise canceling region of FIG. 1.
Figure 4:
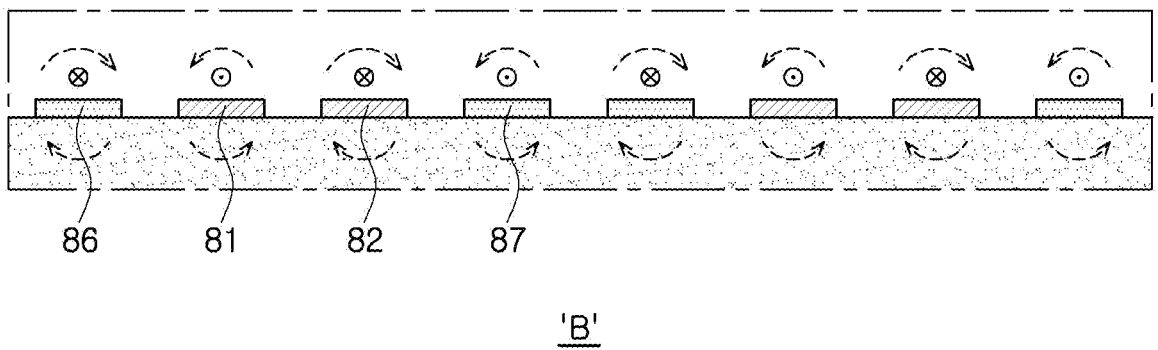
FIG. 4 is an enlarged view of a portion B of FIG. 2.

FIG. 1 is a plan view schematically showing an example of a circuit board, FIG. 2 is a cross-sectional view taken along the line l' in FIG. 1, FIG. 3 is an enlarged view of a noise canceling region of FIG. 1, and FIG. 4 is an enlarged view of a portion B of FIG. 2.

Referring to FIGS. 1 to 4, a circuit board 10 includes a mounting region S1 in which at least one electronic device 1 to be described later is mounted on the circuit board 10, and a first wiring 40 and a second wiring 50 both electrically connected to the mounting region S1.

The circuit board 10 may be a multilayer substrate formed by repeatedly stacking a plurality of insulating layers 19 and a plurality of wiring layers 16. Alternatively, the circuit board 10 may be a double-sided board having the wiring layers 16 formed on both surfaces of one insulating layer 19.

A material of the insulating layer 19 is not limited to any particular material. For example, a thermosetting resin such as an epoxy resin, a thermoplastic resin such as a polyimide resin, or a resin impregnated with a core material such as glass fiber (glass cloth or glass fabric) together with an inorganic filler, for example, an insulating material such as a prepreg, an Ajinomoto Build-up Film (ABF), FR-4, or bismaleimide triazine (BT) may be used.

One or more of the wiring layers 16 may be electrically connected to the electronic device 1.

As a material of the wiring layers 16, a conductive material such as copper (Cu), aluminum (Al), silver (Ag), tin (Sn), gold (Au), nickel (Ni), lead (Pb), titanium (Ti), or an alloy of any two or more thereof may be used.

Interlayer connection conductors 18 for interconnecting the wiring layers 16 are disposed inside the insulating layers 19.

In addition, although not shown, an insulating protective layer may be disposed on a surface of the circuit board 10. The insulating protective layer may be made of a solder resist, and may be disposed so that it covers both the insulating layer 19 and the wiring layers 16 disposed on an upper surface and a lower surface of the insulating layer 19. Accordingly, the insulating protective layer protects the wiring layers 16 disposed on the upper surface and the lower surface of the insulating layer 19.

The circuit board 10 includes a first surface and a second surface on an opposite side of the circuit board 10 from the first surface. The first surface may be used as a mounting surface on which the electronic device 1 is mounted in the mounting region S1. Therefore, a first electrode 11 and a second electrode 12 for mounting the electronic device 1 may be formed on the first surface of the circuit board 10 in the mounting region S1.

A wiring layer 16 disposed on the first surface of the circuit board among the wiring layers 16 of the circuit board 10 may include a first wiring 40, a second wiring 50, and a ground region 60.

The first wiring 40 is connected to the first electrode 11, and may serve as a power wiring that supplies power to the electronic device 1. Thus, the electrode 11 may serve as a power electrode, and the electronic device 1 may include a power terminal that may be bonded to the electrode 11 serving as the power electrode.

The first wiring 40 may be a linear wiring having a constant width. The width of the first wiring 40 may be configured to be the same in all sections of the first wiring 40, but is not limited thereto, and may be configured to have different widths in different sections of the first wiring if necessary.

The second wiring 50 is spaced apart from the first wiring 40 by a predetermined distance, and is parallel to the first wiring 40.

Similarly to the first wiring 40, the second wiring 50 may also be a linear wiring having a constant width. The width of the second wiring 50 may be configured to be the same in all sections of the first wiring, but is not limited thereto, and may be configured to have different widths in different sections of the second wiring 50 if necessary.

The ground region 60 may be a part of the wiring layer 16 disposed in a region of the circuit board 10 without any linear wiring or the electronic device 1. For example, the ground region 60 may be disposed in an entire region of the circuit board 10 except for the mounting region S1 including the first wiring 40 and the second wiring 50, and a noise canceling region S2 to be described later.

The ground region 60 is connected to the second electrode 12, and may serve as a ground plane that that supplies a ground to the electronic device 1. Thus, the electrode 12 may serve as a ground electrode, and the electronic device 1 may include a ground terminal that may be bonded to the electrode 12 serving as the ground electrode.

The second wiring 50 is disposed in the noise canceling region S2, and a first end and a second end of the second wiring 50 are connected to the ground region 60. Therefore, the second wiring 50 may serve as a ground wiring disposed in the noise canceling region S2.

The circuit board 10 configured as described above is a rigid substrate, for example, a printed circuit board (PCB), a ceramic substrate, a pre-molded substrate, a direct bonded copper (DBC) substrate, or an insulated metal substrate (IMS) may be used. However, the circuit board 10 is not limited thereto, and a flexible PCB may also be used.

As discussed above, the first electrode 11 and the second electrode 12 for mounting the electronic device 1 are formed in the mounting region S1. The first electrode 11 may be connected to the first wiring 40, and the second electrode 12 may be connected to the second wiring 50. Accordingly, the electronic device 1 may be electrically connected to the first wiring 40 and the second wiring 50 through the first electrode 11 and the second electrode 12.

The electronic device 1 mounted in the mounting region S1 may be any of various devices such as any of passive devices or any of active devices. Any electronic device 1 can be used as long as it can be mounted on the circuit board 10 or embedded in the circuit board 10. In addition, the electronic device 1 is not limited to a passive device or an active device, but may be any of various components mounted on the circuit board 10 such as a connector or an electrically connecting device.

In addition, the circuit board 10 includes the noise canceling region S2, which is a noise removing unit.

In this example, the noise canceling region S2 is defined as a region in which the first wiring 40 and the second wiring 50 are disposed side by side. In the noise canceling region S2, the first wiring 40 and the second wiring 50 have a meander shape or a zigzag shape including at least one bent portion 80. In this example, the at least one bent portion 80 includes a first bent portion 80a and a second bent portion 80b.

The first bent portion 80a and the second bent portion 80b are spaced apart from each other by a predetermined distance and have the same shape. Therefore, the second bent portion 80b may be considered to be a repetition of the first bent portion 80a. For ease of description, only the first bent portion 80a is described below.

The first wiring 40 in the first bent portion 80a includes a first straight portion 81 and a second straight portion 82 disposed side by side with the first straight portion 81, and a first connection portion 83 connecting an end portion of the first straight portion 81 to an end portion of the second straight portion 82. Currents flowing in the first straight portion 81 and the second straight portion 82 flow in opposite directions as indicated by the arrows in FIG. 3. Accordingly, as indicated by the arrows in FIG. 4, a direction of a magnetic field generated by the current flowing in the first straight portion 81 is opposite to a direction of a magnetic field generated by the current flowing in the second straight portion 82. As a result, interference is generated between the two magnetic fields, causing the two magnetic fields to cancel each other out. Accordingly, an effect of removing noise (for example, electromagnetic radiation noise) can be obtained. In FIG. 4, ⊗ denotes a current flowing into the plane of FIG. 4 away from the eye of the viewer, and ⊙ denotes a current flowing out of the plane of FIG. 4 toward the eye of the viewer.

If a separation distance d1 between the first straight portion 81 and the second straight portion 82 is too large, interference between the magnetic fields generated by the current flowing in the first straight portion 81 and magnetic field flowing in the second straight portion 82 may be reduced, and therefore a noise removal effect may be reduced. By conducting various experiments, the inventor has determined that when the separation distance d1 between the first straight portion 81 and the second straight portion 82 exceeds 1 mm, the noise removal effect is reduced. Therefore, the separation distance d1 between the first straight portion 81 and the second straight portion 82 may be limited to 1 mm or less.

In the first bent portion 80a, the second wiring 50 is disposed side by side with the first wiring 40 and follows the shape of the first wiring 40. In addition, the second wiring 50 in the first bent portion 80a includes a third straight portion 86 disposed side by side with the first straight portion 81 of the first wiring 40, a fourth straight portion 87 disposed side by side with the second straight portion 82 of the first wiring 40, and a second connection portion 88 disposed side by side with the first connection portion 82 and connecting an end portion of the third straight portion 86 to an end portion of the fourth straight portion 87.

As described above, since the first wiring 40 may be used as a power wiring, and the second wiring 50 may be used as a ground wiring, as indicated by the arrows in FIG. 3, the current flowing in the first wiring 40 and the current flowing in the second wiring 50 flow in opposite directions relative to each other because the current flowing in the first (power) wiring 40 flows toward the electronic device 1, and the current flowing in the second (ground) wiring 50 flows away from the electronic device 1.

In addition, similarly to the first straight portion 81 and the second straight portion 82, the current in the third straight portion 86 and the current in the fourth straight portion 87 flow in opposite directions relative to each other. In addition, the current flowing in the third straight portion 86 flows in a direction opposite to a direction of the current flowing in the first straight portion 81, the current flowing in the fourth straight portion 87 flows in a direction opposite to a direction of the current flowing in the second straight portion 82, and the current flowing in the second connection portion 88 flows in a direction opposite to a direction of the current flowing in the first connection portion 83.

As a result of the above configuration, a direction of the magnetic field generated by the first wiring 40 in the first bent portion 80a is opposite to a direction of the magnetic field generated by the second wiring 50 in the first bent portion 80a. As a result, interference is generated between the two magnetic fields, causing the two magnetic fields to cancel each other out. Accordingly, an effect of removing noise (for example, electromagnetic radiation noise) can be obtained.

If a separation distance d2 between the first wiring 40 and the second wiring 50 is too large, the interference between the magnetic generated in the first wiring 40 and the magnetic field generated in the second wiring 50 is reduced, and therefore the noise removal effect may be reduced. Therefore, the separation distance d2 between the first wiring 40 and the second wiring 50 in the noise canceling region S2 may also be limited to 1 mm or less.

If the lengths of the first to fourth straight portions 81, 82, 86, and 87 are very short, magnitudes of the magnetic fields generated by the currents flowing in the first to fourth straight portions 81, 82, 86, and 87 may be very small, which may cause the noise removal effect to be reduced.

As a result of the various experiments performed by the inventor, it was determined that the noise removal effect is reduced when the length L of the first to fourth straight portions 81, 82, 86, and 87 is less than 3 mm. Therefore, a lower limit of the length L of the first to fourth straight portions 81, 82, 86, and 87 may be 3 mm or more. An upper limit of the length L of the first to fourth straight portions 81, 82, 86, and 87 may be limited by an area of the circuit board 10, or a dispositional structure of other wirings disposed on the first surface of the circuit board 10, or the electronic device 1 mounted on the circuit board 10.

In the example of the circuit board 10 described above, since the noise canceling region S2 may function as a noise canceling unit, it is not necessary to mount separate elements on the circuit board 10 to remove noise. Therefore, manufacturing costs and manufacturing time of the circuit board 10 can be minimized.

However, the circuit board 10 is not limited to the example described above, and various modifications are possible as described below.

Figure 5:
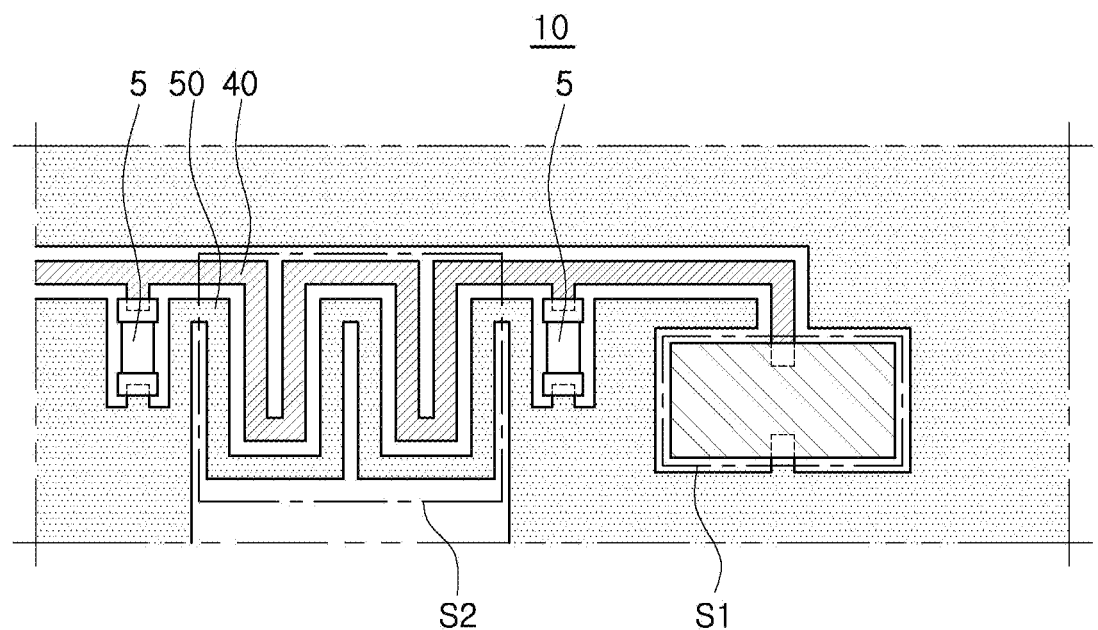
FIG. 5 is a plan view schematically showing another example of a circuit board.

FIG. 5 is a plan view schematically showing another example of a circuit board.

Referring to FIG. 5, the circuit board 10 further includes a plurality of passive devices 5.

The passive devices 5 are disposed outside of the noise canceling region S2, a first terminal of each of the passive devices 5 is connected to the first wiring 40, and a second terminal of each of the passive devices 5 is connected to the ground region 60.

Each of the passive devices 5 may be a capacitor, and the capacitors as the passive devices 5 may be mounted at positions adjacent to opposite sides of the noise canceling region S2.

When the circuit board 10 includes the capacitors as the passive devices 5 as described above, some noise may be removed by the capacitors, and therefore the noise removal effect may be enhanced.

Figure 6:
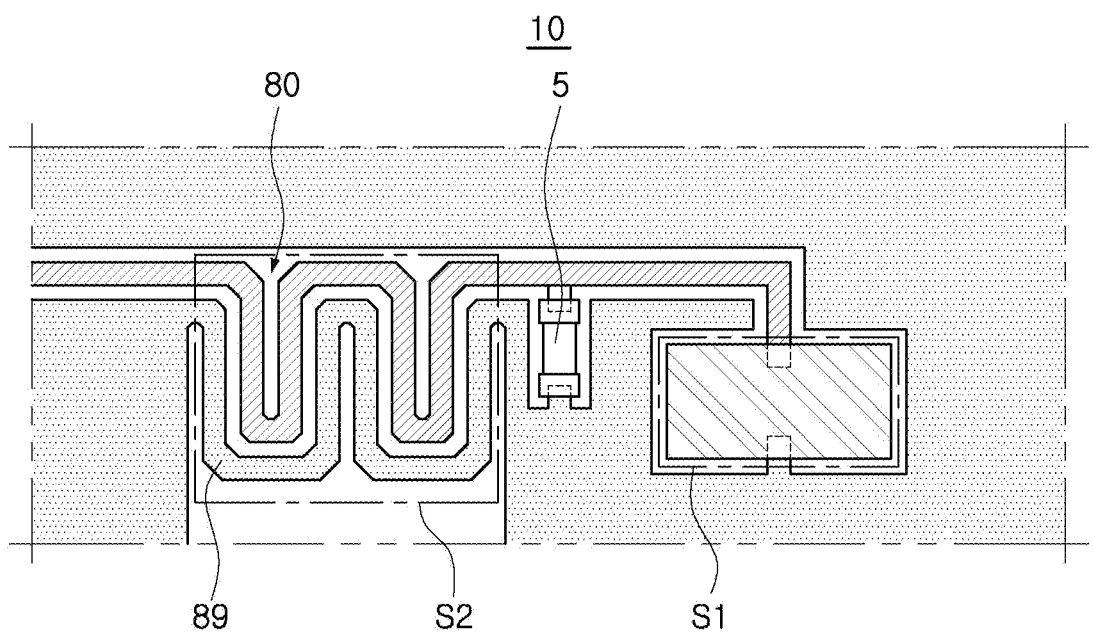
FIG. 6 is a plan view schematically showing another example of a circuit board.
Figure 7:
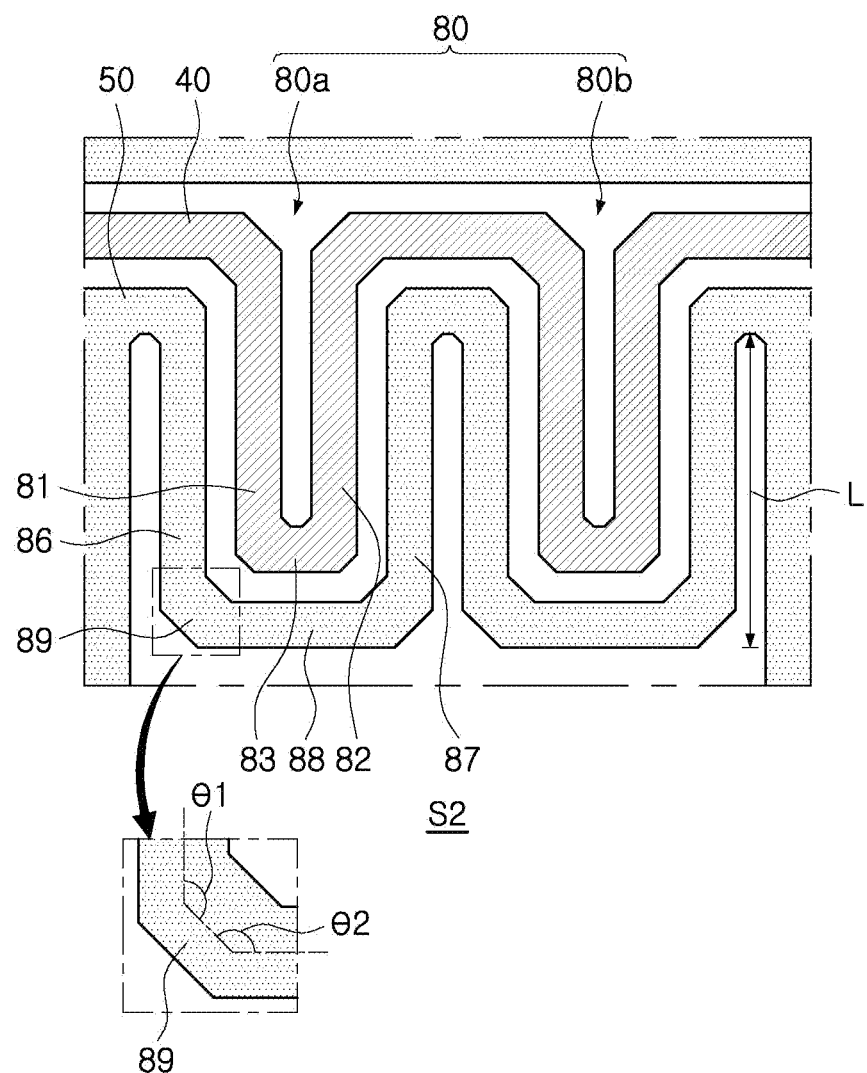
FIG. 7 is an enlarged view of a noise canceling region of FIG. 6.

FIG. 6 is a plan view schematically showing another example of a circuit board, and FIG. 7 is an enlarged view showing a noise canceling region of FIG. 6.

Referring to FIGS. 6 and 7, a circuit board 10 includes transition portions 89 disposed in the bent portion 80a disposed in the noise canceling region S2. For ease of illustration, only one transition portion 89 is shown in FIGS. 6 and 7.

In the examples in FIGS. 1-5 described above, the connection portions 83 and 88 are connected to the straight portions 81, 82, 86, and 87 at a right angle. However, this example, the connection portions 83 and 88 are connected to the straight portions 81, 82, 86, and 87 at an angle that is not a right angle by the transition portions 89.

The transition portions 89 connect the straight portions 81, 82, 86, and 87 to the connection portions 83 and 88 at an angle that is not a right angle. In this example, the transition portions 89 have a diagonal shape with respect to the straight portions 81, 82, 86, and 87 and the connection portions 83 and 88. That is, the transition portions 89 have a linear shape oriented at an angle other than a right angle with respect to the straight portions 81, 82, 86, and 87 and the connection portions 83 and 88.

An included angle θ1 between the transition portions 89 and the straight portions 81, 82, 86, and 87 as shown in FIG. 7 is 135°, and an included angle θ2 between the transition portions 89 and the connection portions 83 and 88 as shown in FIG. 7 is 135°. However, this is merely an example, and the included angles θ1 and θ2 may have other values.

When the straight portions 81, 82, 86, and 87 are connected to the connection portions 83 and 88 at a right angle as in the examples in FIGS. 1-5 described above, a capacitance may be generated at the right angle where the first wiring 40 and the second wiring 50 change direction, and this capacitance may adversely affect the currents flowing in the first wiring 40 and the second wiring 50.

Therefore, in this example, to minimize the above-described effect, the first wiring 40 and the second wiring 50 are configured so that the straight portions 81, 82, 86, and 87 are connected to the connection portions 83 88 by the transition portions 89. In this case, it is possible to maximize the included angle θ1 between the straight portions 81, 82, 86, and 87 and the transition portions 89, and the included angle θ2 between the transition portions 89 and the connection portions 83 and 89, thereby minimizing a capacitance generated at the transition portions 89 where the first wiring 40 and the second wiring 50 change direction.

In the example described above, the transition portions 89 have a diagonal shape, but are not limited thereto, and may have other shapes, such as a curved shape.

Referring to FIG. 6, the circuit board 10 further includes a passive device 5.

The passive device 5 is disposed outside the noise canceling region S2, a first terminal of the passive device 5 is connected to the first wiring 40, and a second terminal of the passive device 5 is connected to the ground region 60.

The passive device 5 may be a capacitor, and the capacitor as the passive device 5 may be mounted at a position adjacent to a side of the noise canceling region S2 closest to the mounting region S1 as illustrated in FIG. 6. Alternatively, the capacitor as the passive device 5 may be mounted at a position adjacent to a side of the noise canceling region S2 farthest away from the mounting region S1.

When the circuit board 10 includes the capacitor as the passive device 5 as described above, some noise may be removed by the capacitor, and therefore the noise removal effect may be enhanced.

Although the circuit board 10 in FIG. 6 includes one passive device 5, this is just an example, and the circuit board 10 in FIG. 6 may include two passive devices as shown in FIG. 5, or the passive device 5 may be omitted as shown in FIG. 1.

In some of the examples described above, since a noise canceling region provided on the circuit board functions as a noise canceling circuit, it is not necessary to mount separate elements on the circuit board to remove the noise. Therefore, manufacturing costs and manufacturing time of the circuit board can be minimized.

In the examples described above, both the first wiring and the second wiring are disposed on the first surface of the circuit board, but the configuration of the circuit board is not limited thereto, and it is also possible to dispose the first wiring and the second wiring on different wiring layers of the circuit board. In this case, the first wiring and the second wiring may be disposed side by side in the vertical direction, and may be spaced apart from each other by an insulating layer.

The examples of the circuit board described above include only one noise removing unit, but various modifications of the circuit board are possible, such as disposing a plurality of noise removing units on one circuit board if necessary to increase an amount of noise that is removed.

While this disclosure includes specific examples, it will be apparent after an understanding of the disclosure of this application that various changes in form and details may be made in these examples without departing from the sprit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board comprising:
   an insulating layer; and
   a wiring layer disposed on a surface of the insulating layer,
   wherein the wiring layer comprises a noise canceling region comprising:
      a first wiring having a linear shape; and
      a second wiring having a linear shape and disposed side by side with the first wiring,
      wherein the first wiring and the second wiring comprise a bent portion,
   the wiring layer further comprises a ground region disposed outside of the noise canceling region, and
   a first end and a second end of the second wiring are connected to the ground region.

2. The circuit board of claim 1, wherein in the bent portion, the first wiring comprises:
   a first straight portion;
   a second straight portion disposed side by side with the first straight portion; and
   a first connection portion connecting an end portion of the first straight portion to an end portion of the second straight portion.

3. The circuit board of claim 2, wherein the first wiring and the second wiring are configured so that a current flowing in the first straight portion and a current flowing in the second straight portion flow in opposite directions relative to each other.

4. The circuit board of claim 2, wherein a separation distance between the first straight portion and the second straight portion is 1 mm or less.

5. The circuit board of claim 2, wherein in the bent portion, the second wiring comprises:
   a third straight portion disposed side by side with the first straight portion;
   a fourth straight portion disposed side by side with the second straight portion; and
   a second connection portion disposed side by side with the first connection portion and connecting an end portion of the third straight portion to an end portion of the fourth straight portion.

6. The circuit board of claim 5, wherein the first wiring and the second wiring are configured so that a current flowing in the first connection portion and a current flowing in the second connection portion flow in opposite directions relative to each other.

7. The circuit board of claim 5, wherein the first straight portion, the second straight portion, the third straight portion, and the fourth straight portion each have a length of 3 mm or more.

8. The circuit board of claim 1, wherein a separation distance between the first wiring and the second wiring is 1 mm or less.

9. The circuit board of claim 1, further comprising an electronic device mounted on the circuit board and electrically connected to the first wiring and the second wiring.

10. The circuit board of claim 9, further comprising a first electrode and a second electrode disposed in the mounting region,
   wherein the electronic device is mounted on the first electrode and the second electrode,
   the first wiring is connected to the first electrode and serves as a power wiring that supplies power to the electronic device via the first electrode, and
   the second wiring is connected to the second electrode and serves as a ground wiring that supplies a ground to the electronic device via the second electrode.

11. The circuit board of claim 9, wherein in the noise canceling region, the first wiring and the second wiring are configured so that a current flowing in the first wiring and a current flowing in the second wiring flow in opposite directions relative to each other.

12. The circuit board of claim 1, wherein the first wiring and the second wiring each have a meander shape comprising the bent portion.

13. The circuit board of claim 1, further comprising a passive device electrically connected to the first wiring and the second wiring.

14. The circuit board of claim 1, wherein in the bent portion, the first wiring comprises:
   a first straight portion;
   a second straight portion disposed side by side with the first straight portion;
   a first connection portion;
   a first transition portion connecting an end portion of the first straight portion to a first end portion of the first connection portion; and
   a second transition portion connecting an end portion of the second straight portion to a second end portion of the first connection portion.

15. The circuit board of claim 14, wherein the first transition portion and the second transition portion each have a diagonal shape.

16. The circuit board of claim 15, wherein a first included angle between the first straight portion and the first transition portion is 135°,
   a second included angle between the first transition portion and the first connection portion is 135°,
   a third included angle between the second straight portion and the second transition portion is 135°, and
   a fourth included angle between the second transition portion and the first connection portion is 135°.

17. The circuit board of claim 14, wherein the first transition portion and the second transition portion each have a curved shape.

18. A circuit board comprising:
   an insulating layer; and
   a wiring layer disposed on a surface of the insulating layer,
   wherein the wiring layer comprises a noise canceling region comprising:
      a first wiring having a meander shape; and
      a second wiring having a meander shape following the meander shape of the first wiring and spaced apart from the first wiring,
   the wiring layer further comprises a ground region disposed outside of the noise canceling region, and
   a first end and a second end of the second wiring are connected to the ground region.

19. The circuit board of claim 18, wherein the first wiring and the second wiring are configured so that a magnetic field generated by a current flowing in the first wiring cancels a magnetic field generated by a current flowing in the second wiring.

* * * * *